(12) United States Patent
Kang

(10) Patent No.: US 9,117,505 B2
(45) Date of Patent: Aug. 25, 2015

(54) VOLTAGE GENERATION CIRCUIT, AND WRITE DRIVER AND SEMICONDUCTOR MEMORY APPARATUS INCLUDING THE SAME

(71) Applicant: SK hynix Inc., Icheon-si Gyeonggi-do (KR)

(72) Inventor: Seok Joon Kang, Icheon-si (KR)

(73) Assignee: SK Hynik Inc., Gyeonggi-do (KR)

( * ) Notice: Subject to any disclaimer, the term of this patent is extended or adjusted under 35 U.S.C. 154(b) by 303 days.

(21) Appl. No.: 13/846,678

(22) Filed: Mar. 18, 2013

(65) Prior Publication Data

US 2014/0160872 A1  Jun. 12, 2014

(30) Foreign Application Priority Data

Dec. 11, 2012  (KR) .................. 10-2012-0143635

(51) Int. Cl.
| | |
|---|---|
| *G11C 7/12* | (2006.01) |
| *G11C 7/14* | (2006.01) |
| *G11C 13/00* | (2006.01) |
| *G11C 8/08* | (2006.01) |
| *G11C 11/56* | (2006.01) |
| *G11C 5/14* | (2006.01) |

(52) U.S. Cl.
CPC .. *G11C 7/14* (2013.01); *G11C 5/14* (2013.01); *G11C 7/12* (2013.01); *G11C 8/08* (2013.01); *G11C 11/5678* (2013.01); *G11C 13/0004* (2013.01); *G11C 13/0009* (2013.01); *G11C 13/0038* (2013.01); *G11C 13/0069* (2013.01); *G11C 2013/0078* (2013.01); *G11C 2013/0092* (2013.01)

(58) Field of Classification Search
CPC .. G11C 7/12; G11C 13/0004; G11C 13/0038; G11C 13/009; G11C 13/0092
USPC .................. 365/189.16, 148, 230.06
See application file for complete search history.

(56) References Cited

U.S. PATENT DOCUMENTS

| | | | |
|---|---|---|---|
| 6,570,784 B2 * | 5/2003 | Lowrey ..................... 365/163 |
| 6,900,672 B2 | 5/2005 | Callahan, Jr. | |
| 7,154,310 B2 | 12/2006 | Kojima | |
| 7,359,231 B2 | 4/2008 | Venkataraman et al. | |
| 2006/0233019 A1 * | 10/2006 | Kostylev et al. ............. 365/163 |
| 2009/0034320 A1 * | 2/2009 | Ueda ............................ 365/148 |
| 2009/0116280 A1 * | 5/2009 | Parkinson et al. ........... 365/163 |
| 2010/0020594 A1 * | 1/2010 | De Sandre et al. .......... 365/163 |
| 2013/0308396 A1 * | 11/2013 | CHO et al. ............. 365/189.09 |

* cited by examiner

Primary Examiner — Hoai V Ho
Assistant Examiner — Jay Radke
(74) Attorney, Agent, or Firm — William Park & Associates Ltd.

(57) ABSTRACT

A voltage generation circuit includes a charge unit and a discharge unit. The charge unit is configured for raising a level of a ramp voltage to a predetermined level in response to a control signal. The discharge unit is configured for lowering the level of the ramp voltage in response to the control signal. The discharge unit uses a constant current source to lower the level of the ramp voltage.

20 Claims, 8 Drawing Sheets

VOLTAGE GENERATION CIRCUIT, AND WRITE DRIVER AND SEMICONDUCTOR MEMORY APPARATUS INCLUDING THE SAME

CROSS-REFERENCES TO RELATED APPLICATION

The present application claims priority under 35 U.S.C. §119(a) to Korean application number 10-2012-0143635, filed on Dec. 11, 2012, in the Korean Intellectual Property Office, which is incorporated herein by reference in its entirety.

BACKGROUND

1. Technical Field

The present invention generally relates to a semiconductor apparatus, and more particularly, to a voltage generation circuit, and a write driver and a semiconductor memory apparatus including the same.

2. Related Art

A volatile memory apparatus such as a DRAM has a disadvantage in that, because a memory cell is constituted by a capacitor, stored data cannot be retained when the power supply is interrupted. In order to overcome such a disadvantage, a nonvolatile memory apparatus has been developed, in which a memory cell is constituted by a resistance variable device such as a phase change device to retain data even when the power supply is interrupted.

FIG. 1 is a diagram showing a resistive memory cell MC and a write voltage for writing data in the memory cell. The resistive memory cell MC is constituted by a resistance variable device, and has a resistance value that changes according to a voltage VWRT or current IWRT flowing through it. In particular, in the case where the resistance variable device is a phase change device, the memory cell MC can be converted into a crystalline state and an amorphous state according to the current IWRT to store specific data. In general, a set voltage SET is needed to convert the memory cell MC into the crystalline state, and a reset voltage RESET is needed to convert the memory cell MC into the amorphous state.

The set voltage SET and the reset voltage RESET should be generated as shown in the graph of FIG. 1. The reset voltage RESET may be generated by applying a voltage of a high level to the memory cell MC for a short time, and the set voltage SET may be generated by applying a voltage of a level lower than the reset voltage RESET for a long time. Specifically, the set voltage SET should have a slow quenching slope that decreases slowly to convert the memory cell MC into the crystalline state. The x-axis showing time TIME.

FIG. 2 is a diagram showing the configuration of a conventional voltage generation circuit 10 for generating a ramp voltage VRAMP used to generate the set voltage SET of FIG. 1 and the ramp voltage VRAMP generated by the voltage generation circuit. In FIG. 2, the voltage generation circuit 10 includes a DAC (digital-to-analog converter) 11, a power application unit 12, a plurality of switches, and current sources which are coupled in series with the plurality of switches.

The DAC 11 generates code signals C<0:5> which turn on or off the plurality of switches to generate the ramp voltage VRAMP. The levels of the respective bits of the code signals C<0:5> may vary with the lapse of time TIME. When an enable signal EN is applied, the power application unit 12 applies a power supply voltage VDD to a node from which the ramp voltage VRAMP is generated, such that the ramp voltage VRAMP reaches a predetermined level. Thereafter, when the switches are turned on by the code signals C<0:5>, the node from which the ramp voltage VRAMP is generated is discharged to a ground voltage VSS through the current sources. Thus, the ramp voltage VRAMP may decrease in a step-like pattern as shown in the graph of FIG. 2 and may generate a slow quenching pulse.

However, in the voltage generation circuit 10, since the level of the ramp voltage VRAMP is controlled according to the code signals C<0:5> generated by the DAC 11, a problem is caused in that the ramp voltage VRAMP is not likely to be normally generated according to level variations of the respective bits of the code signals C<0:5>. For example, in the case where the MSB (most significant bit) of the code signals C<0:5> generated by the DAC 11 varies, a serious glitch may occur as shown in FIG. 3A (i.e., Glitch Occurrence), so the ramp voltage VRAMP is not normally generated. Also, due to the linear characteristic of the DAC 11, a slope at which the ramp voltage VRAMP decreases may be irregularly changed as shown in FIG. 3B (i.e., Slope change or Normal Slope). Abnormal generation of the ramp voltage VRAMP may influence the set voltage SET which writes data to the memory cell, and thus, the memory cell may not be converted into a desired crystalline state. As a consequence, a phenomenon is likely to occur, in which incorrect data is written to the memory cell.

SUMMARY

A voltage generation circuit capable of generating a ramp voltage continuously decreasing with a constant slope is described herein.

Also, a write driver and a semiconductor memory apparatus capable of generating a ramp voltage decreasing with a constant slope and capable of stably retaining the level of the ramp voltage are described herein.

In an embodiment of the present invention, a voltage generation circuit includes: a charge unit configured for raising a level of a ramp voltage to a predetermined level in response to a control signal; and a discharge unit configured for lowering the level of the ramp voltage in response to the control signal; wherein the discharge unit uses a constant current source to lower the level of the ramp voltage.

In an embodiment of the present invention, a voltage generation circuit includes: a charge unit configured to raise a level of a ramp voltage to a predetermined level in response to a control signal and level setting signals; a discharge unit configured to constantly lower the level of the ramp voltage raised to the predetermined level in response to the control signal; and an output unit configured to compare levels of the ramp voltage and an output voltage and generate the output voltage.

In an embodiment of the present invention, a write driver includes: a reset voltage generation unit configured to generate a reset voltage; a set voltage generation unit configured to generate a set voltage which is raised to a predetermined level and is lowered with a constant slope based on a control signal and level setting signals; a write voltage output unit configured to generate a write voltage based on one of the reset voltage and the set voltage in response to write control signals; and a dummy unit configured to increase capacitance of a node from which the set voltage is generated, in response to the write control signals.

In an embodiment of the present invention, a semiconductor memory apparatus includes: a write control unit configured to generate a control signal, level setting signals and write control signals in response to write data and a write signal; a reset voltage generation unit configured to generate a reset voltage; a set voltage generation unit configured to generate a set voltage which is raised to a predetermined level and is lowered with a constant slope based on the control signal and the level setting signals; a write voltage output unit configured to generate a write voltage based on one of the reset voltage and the set voltage in response to the write control signals; a dummy unit configured to increase capacitance of a node from which the set voltage is generated, in response to the write control signals; and a memory cell configured to store the write data according to the write voltage.

BRIEF DESCRIPTION OF THE DRAWINGS

Features, aspects, and embodiments are described in conjunction with the attached drawings, in which.

DETAILED DESCRIPTION

Hereinafter, a voltage generation circuit, and a write driver and a semiconductor memory apparatus including the same according to the present invention will be described below with reference to the accompanying drawings through various embodiments.

Figure 1:
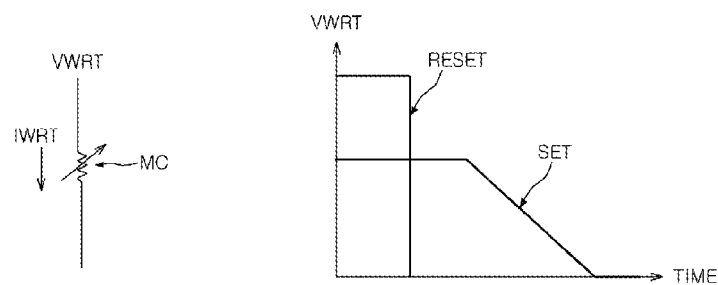
FIG. 1 is a diagram showing a resistive memory cell and a write voltage for writing data in the memory cell.
Figure 2:
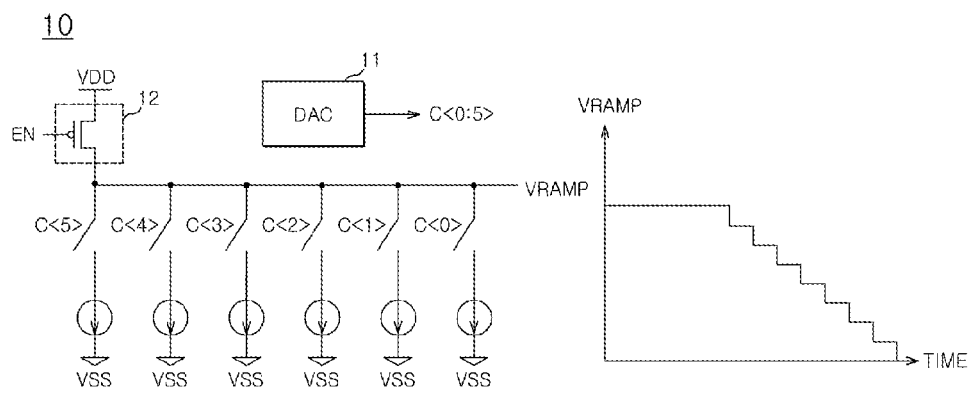
FIG. 2 is a diagram showing the configuration of a conventional voltage generation circuit for generating a ramp voltage used to generate the set voltage of FIG. 1 and the ramp voltage generated by the voltage generation circuit.
Figure 3A:
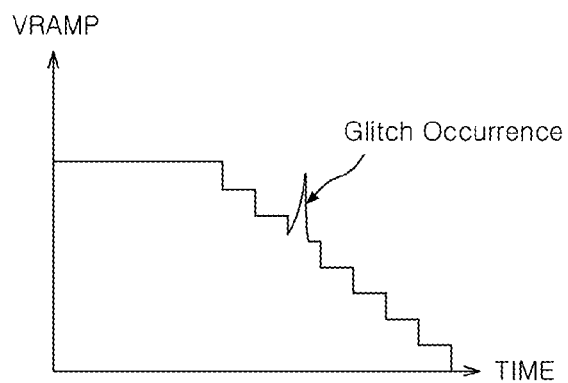
FIGS. 3A and 3B are graphs exemplifying cases where a ramp voltage is not normally generated.
Figure 3B:
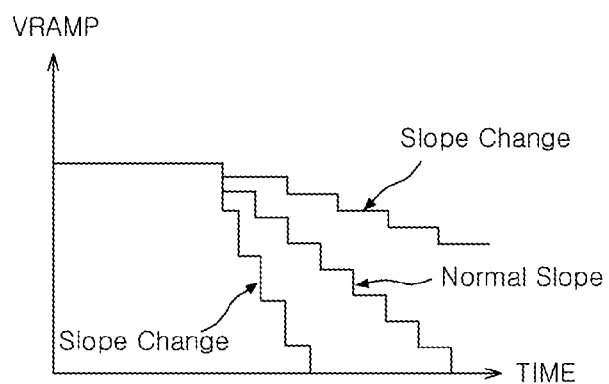
Figure 4:
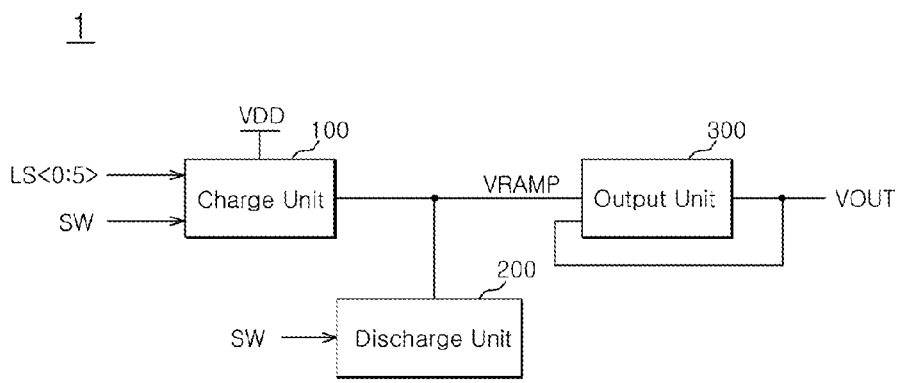
FIG. 4 is a block diagram schematically showing the configuration of a voltage generation circuit in accordance with an embodiment of the present invention.

FIG. 4 is a block diagram schematically showing the configuration of a voltage generation circuit 1 in accordance with an embodiment of the present invention. In FIG. 4, the voltage generation circuit 1 may be configured to generate a ramp voltage VRAMP which increases to a predetermined level and continuously decreases with a constant slope. The voltage generation circuit 1 may include a charge unit 100 and a discharge unit 200. The charge unit 100 may be configured to raise the level of the ramp voltage VRAMP to the predetermined level in response to a control signal SW and level setting signals LS<0:5>. The charge unit 100 may raise the level of the ramp voltage VRAMP when the control signal SW has a first level, and may control the maximum raise level of the ramp voltage VRAMP in response to the level setting signals LS<0:5>.

The discharge unit 200 may be configured to lower the level of the ramp voltage VRAMP which is raised to the predetermined level, with the constant slope. The discharge unit 200 does not discretely lower but continuously and linearly lowers the level of the ramp voltage VRAMP. The discharge unit 200 may lower the level of the ramp voltage VRAMP when the control signal SW has a second level. Without a limiting sense, the control signal SW and the level setting signals LS<0:5> may be provided, for example, from a control circuit such as a state machine.

The voltage generation circuit 1 further may include an output unit 300. The output unit 300 may be configured to generate an output voltage VOUT based on the ramp voltage VRAMP. The output unit 300 may compare the level of the ramp voltage VRAMP and the level of the output voltage VOUT. The output unit 300 may control the level of the output voltage VOUT according to a comparison result.

Figure 5:
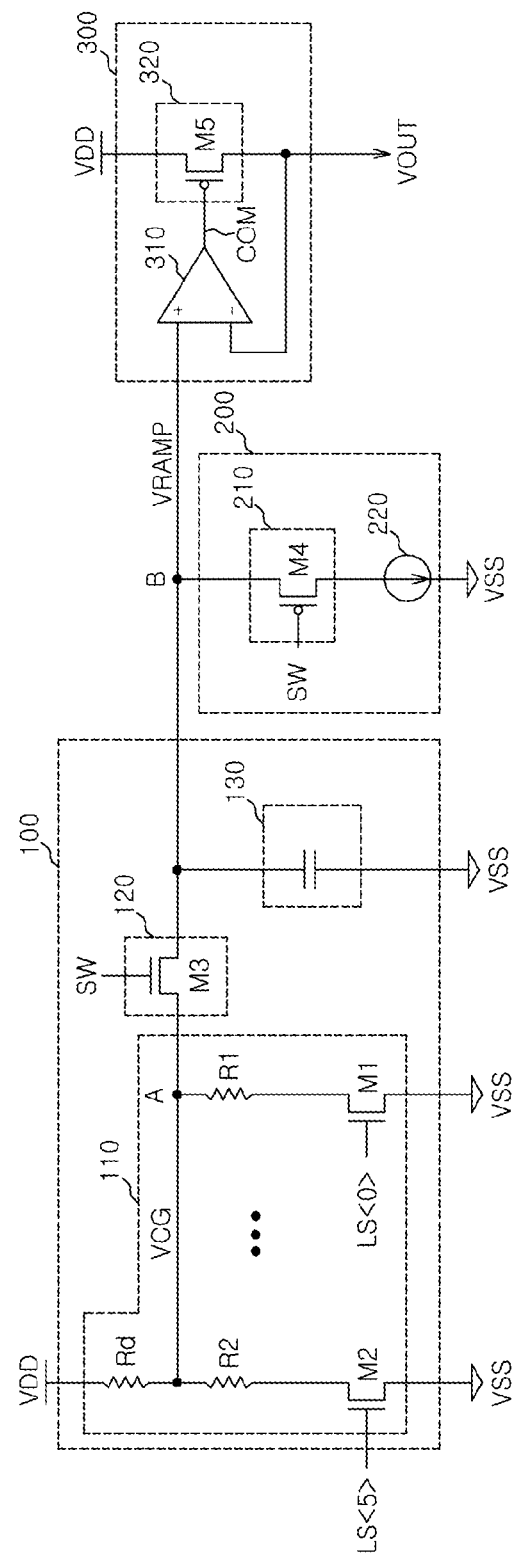
FIG. 5 is a diagram showing the detailed configuration of the voltage generation circuit of FIG. 4.

FIG. 5 is a diagram showing in detail the configuration of the voltage generation circuit 1 of FIG. 4. In FIG. 5, the charge unit 100 may include a voltage applying section 110, a first switching section 120 and a first capacitor 130. The voltage applying section 110 may be configured to provide a voltage VCG of the predetermined level to the first switching section 120 in response to the level setting signals LS<0:5>. In FIG. 5, the voltage applying section 110 may include a plurality of voltage level control parts. The voltage applying section 110 applies a power supply voltage VDD to the first switching section 120, and controls the level of the voltage provided to the first switching section 120, by the plurality of voltage level control parts. The voltage level control parts may change the level of the voltage provided to the first switching section 120, in response to the level setting signals LS<0:5>, respectively. Each of the voltage level control parts may include a resistor (i.e., R) and a MOS transistor (i.e., M) which are coupled in series. For example, a first voltage level control part may include a first resistor R1 having one end which is coupled with the first switching section 120, and a first MOS transistor M1 connecting the other end of the first resistor R1 with a ground voltage VSS and having the gate which receives the first bit LS<0> of the level setting signals LS<0:5>. Accordingly, when the first MOS transistor M1 is turned on by the first bit LS<0> of the level setting signals LS<0:5>, an output node A of the voltage applying section 110 (that is, the node to which the voltage applying section 110 and the first switching section 120 are coupled) may be coupled with the ground voltage VSS through the first resistor R1, and the voltage level of the node A may be lowered from the level of the power supply voltage VDD according to the ratio between a divider resistor Rd and the first resistor R1.

Further, a second voltage level control part may include a second resistor R2 having one end which is coupled with the first switching section 120, and a second MOS transistor M2 connecting the other end of the second resistor R2 with the ground voltage VSS and having the gate which receives the sixth bit LS<5> of the level setting signals LS<0:5>. Accordingly, when the second MOS transistor M2 is turned on by the sixth bit LS<5> of the level setting signals LS<0:5>, the node A may be coupled with the ground voltage VSS through the second resistor R2, and the level of the voltage provided to the first switching section 120 may be controlled according to the ratio between the parallel resistors of the first resistor R1 of the first voltage level control part and the second resistor R2 of the second voltage level control part and the divider resistor Rd. As the voltage applying section 110 includes the plurality of voltage level control parts, the level of the voltage VCG provided to the first switching section 120 may be controlled in various manners. Moreover, in the case where the values of the resistors Rd, R1 and R2 included in the voltage level control parts are set to be different from one another, the voltage level of the node A may be controlled in further various manners.

The first switching section 120 may be configured to transfer the voltage VCG provided from the voltage applying section 110 to the first capacitor 130 in response to the control signal SW. The first switching section 120 may include a third MOS transistor M3. The third MOS transistor M3 has one end which may be coupled with the voltage applying section 110 (that is, the node A), the other end which may be coupled with one end of the first capacitor 130 and a ramp voltage output node B, and the gate which receives the control signal SW. The third MOS transistor M3 may be an NMOS transistor. Therefore, when the control signal SW has the first level, that is, a high level, the first switching section 120 may transfer the voltage provided from the voltage applying section 110, to the first capacitor 130.

The first capacitor 130 may be charged by receiving the voltage VCG transferred from the first switching section 120. The first capacitor 130 may have the one end which may be coupled with the first switching section 120 and the other end which may be coupled with the ground voltage VSS. When the control signal SW has the first level, since the first switching section 120 transfers the voltage VCG provided from the voltage applying section 110, to the first capacitor 130, the first capacitor 130 may accumulate a charge. Accordingly, the level of the ramp voltage VRAMP may be raised to the level of the voltage provided from the voltage applying section 110.

The discharge unit 200 may include a second switching section 210 and a current source 220. The second switching section 210 may be configured to electrically connect the node B from which the ramp voltage VRAMP is outputted, with the current source 220 in response to the control signal SW. The current source 220 may be configured to electrically connect the node B from which the ramp voltage VRAMP is outputted, with the ground voltage VSS through the second switching section 210.

The second switching section 210 may include a fourth MOS transistor M4. The fourth MOS transistor M4 may be, for example, a PMOS transistor. Hence, the fourth MOS transistor M4 may be turned on when the control signal SW has the second level and may electrically connect the node B from which the ramp voltage VRAMP is outputted, with the current source 220. If the fourth MOS transistor M4 is turned on, the current source 220 forms a current path between the node B and the ground voltage VSS and causes a predetermined amount of current to flow from the node B to the ground voltage VSS. Therefore, it is possible to lower the voltage level of the node B with a constant slope.

In FIG. 5, the output unit 300 may include a comparator 310 and a driver 320. The comparator 310 may be configured to compare the level of the ramp voltage VRAMP and the level of the output voltage VOUT and generate a comparison signal COM. The driver 320 may be configured to control the level of the output voltage VOUT according to the comparison signal COM. The driver 320 may include a fifth MOS transistor M5. The fifth MOS transistor M5 may receive the comparison signal COM through the gate, may receive the power supply voltage VDD through one of the drain and the source, and may output the output voltage VOUT through the other of the drain and the source. Since the driver 320 may control the level of the output voltage VOUT according to the comparison signal COM which may be generated by comparing the levels of the ramp voltage VRAMP and the output voltage VOUT, it is possible to generate the output voltage VOUT which has substantially the same level as the ramp voltage VRAMP.

Figure 6:
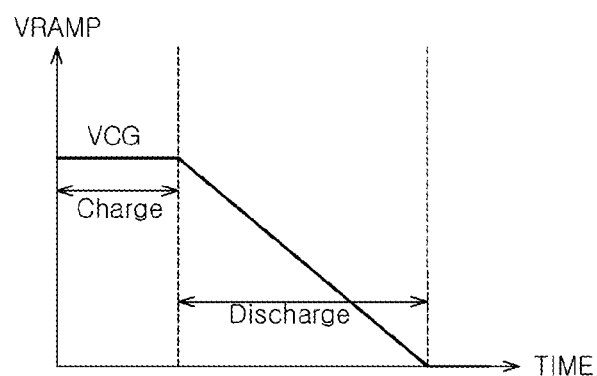
FIG. 6 is a graph showing the waveform of a ramp voltage which explains the operations of the voltage generation circuit of FIGS. 4 and 5.

FIG. 6 is a graph explaining the operations of the voltage generation circuit 1 shown in FIGS. 4 and 5. The voltage applying section 110 generates the voltage VCG with the predetermined level according to the level setting signals LS<0:5>. When the control signal SW has the first level, the first switching section 120 is turned on, and the voltage generated by the voltage applying section 110 is provided to the first capacitor 130. Accordingly, the first capacitor 130 is charged with the voltage VCG provided from the voltage applying section 110 while the control signal SW has the first level, and the ramp voltage VRAMP is raised to the predetermined level of the voltage VCG (i.e., Charge). Thereafter, when the control signal SW has the second level, the first switching section 120 is turned off, and the second switching section 210 is turned on. Accordingly, the first capacitor 130 is not charged any more, and is discharged at a constant speed by the current source 220. Since the discharge unit 200 discharges the first capacitor 130 through the constant current source 220, the level of the ramp voltage VRAMP is not discretely lowered but may be continuously lowered with the constant slope (i.e., Discharge).

Figure 7A:
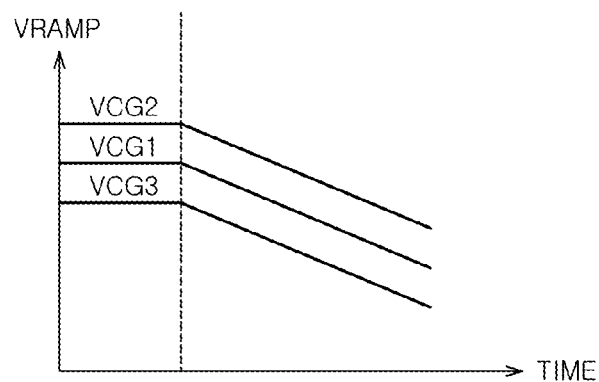
FIGS. 7A and 7B are graphs showing the waveforms of various ramp voltages which can be generated by the voltage generation circuit.
Figure 7B:
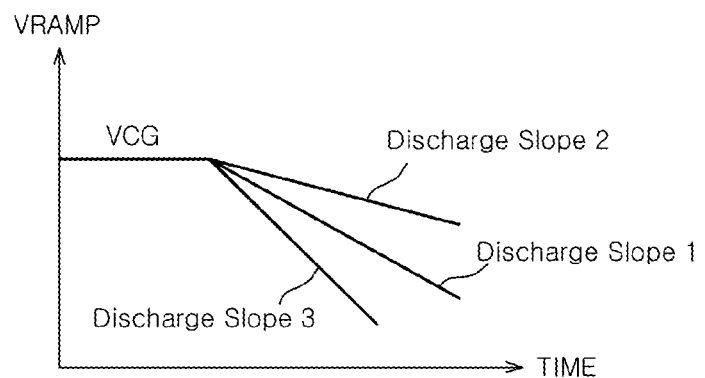

FIGS. 7A and 7B are graphs showing the waveforms of various ramp voltages VRAMP which can be generated by the voltage generation circuit 1 of FIGS. 4 and 5. FIG. 7A shows the case where the size of the current source 220 is fixed and changes are made to voltages VCG1, VCG2 and VCG3 of predetermined levels provided from the voltage applying section 110. In this case, the charge amount of the first capacitor 130 is changed, and the predetermined levels of the voltages VCG1, VCG2 and VCG3 as the ramp voltage VRAMP may be increased or decreased in a variety of ways. FIG. 7B shows the case where the voltage VCG of the predetermined level provided from the voltage applying section 110 is fixed and the size of the current source 220 is changed. In this case, the discharge amount of the first capacitor 130 is changed, and the level of the ramp voltage VRAMP may be lowered with a sharp slope or a slow slope (i.e., Discharge Slope 2). That is to say, a time required for the level of the ramp voltage VRAMP to be lowered may be changed (i.e., Discharge Slope 1, 2, and 3). The above-described various waveforms of the ramp voltage VRAMP are useful when the ramp voltage VRAMP is used as a write voltage for storing data in a memory cell of a semiconductor memory apparatus. For example, when storing data in a multi-level cell capable of storing multi-bit data, by variously changing the ramp voltage VRAMP as described above, the resistant state of the multi-level cell may be changed in a variety of ways.

Figure 8:
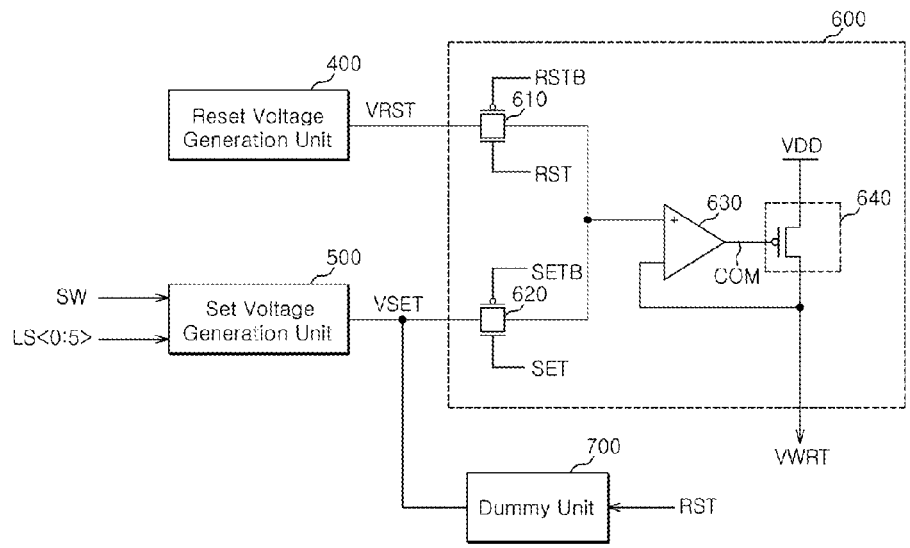
FIG. 8 is a diagram showing the configuration of a write driver in accordance with an embodiment of the present invention.

FIG. 8 is a diagram schematically showing the configuration of a write driver 2 in accordance with an embodiment of the present invention. In FIG. 8, the write driver 2 may include a reset voltage generation unit 400, a set voltage generation unit 500, a write voltage output unit 600, and a dummy unit 700. The reset voltage generation unit 400 may be configured to generate a reset voltage VRST. The set voltage generation unit 500 may be configured to generate a set voltage VSET which increases to a predetermined level and decreases with a constant slope in response to the control signal SW and the level setting signals LS<0:5>. The set voltage generation unit 500 may utilize the configuration of the voltage generation circuit 1 shown in FIG. 4, and the ramp voltage VRAMP generated by the voltage generation circuit 1 may be the set voltage VSET of FIG. 8. The reset voltage VRST is a voltage which is used to write reset data, and the set voltage VSET is a voltage which is used to write set data.

The write voltage output unit 600 may be configured to generate a write voltage VWRT based on one of the reset voltage VRST and the set voltage VSET in response to write control signals RST and SET. The write control signals RST and SET include a reset signal RST and a set signal SET. The write voltage output unit 600 generates the write voltage VWRT based on the reset voltage VRST when the reset signal RST is enabled, and generates the write voltage VWRT based on the set voltage VSET when the set signal SET is enabled.

The write voltage output unit 600 may include a first pass gate 610, a second pass gate 620, a comparator 630, and a driver 640. The first pass gate 610 may be configured to be turned on in response to the reset signal RST and an inverted signal RSTB thereof and provide the reset voltage VRST to the comparator 630 when being turned on. The second pass gate 620 may be configured to be turned on in response to the set signal SET and an inverted signal SETB thereof and provide the set voltage VSET to the comparator 630 when being turned on.

The comparator 630 may be configured to compare one of the reset voltage VRST and the set voltage VSET outputted through the first and second pass gates 610 and 620, with the write voltage VWRT, and generate a comparison signal COM. The driver 640 may be configured to control the level of the write voltage VWRT according to the comparison signal COM. The configurations of the comparator 630 and the driver 640 are the same as the configuration of the output unit 300 shown in FIG. 5.

The dummy unit 700 may be configured to increase the capacitance of a node from which the set voltage VSET is generated, in response to the write control signals. The dummy unit 700 may increase the capacitance of the node from which the set voltage VSET is generated, when the reset signal RST of the write control signals is enabled. In an embodiment, the capacitance increased by the dummy unit 700 may be substantially the same as the equivalent capacitance of the comparator 630 and the driver 640. The set voltage generation unit 500 may generate the set voltage VSET which increases to the predetermined level and decreases with the constant slope, by charging and discharging the first capacitor 130 of FIG. 5. Accordingly, a problem may be caused in that the slope may be changed according to the magnitude of the capacitance anticipated by the set voltage generation unit 500. If the set signal SET is enabled and the second pass gate 620 is turned on, the set voltage generation unit 500 anticipates the equivalent capacitance of the comparator 630 and the driver 640. If the set signal SET is disabled and the second pass gate 620 is turned off, the set voltage generation unit 500 anticipates the capacitance reduced by the equivalent capacitance. Accordingly, the capacitance anticipated by the set voltage generation unit 500 is changed according to whether the set signal SET is enabled or not. In order to prevent the downward slope of the set voltage VSET from being changed according to a capacitance change, the dummy unit 700 provides additional capacitance to the set voltage generation unit 500. Accordingly, since the set voltage generation unit 500 may always anticipate the same capacitance by the dummy unit 700 regardless of whether the second pass gate 620 is turned on or not, it is possible to generate the set voltage VSET which is constantly changed.

Figure 9:
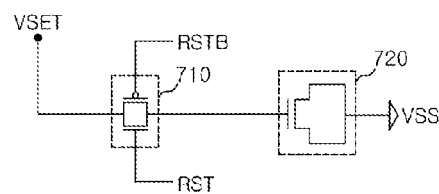
FIG. 9 is a diagram showing the configuration of an embodiment of the dummy unit of FIG. 8.

FIG. 9 is a diagram showing the configuration of an embodiment of the dummy unit 700 of FIG. 8. In FIG. 9, the dummy unit 700 may include a third pass gate 710 and a second capacitor 720. The third pass gate 710 may be turned on in response to the reset signal RST of the write control signals. The second capacitor 720 may be coupled with the node from which the set voltage VSET is generated, when the third pass gate 710 is turned on. The second capacitor 720 may have a capacitance value with substantially the same magnitude as the equivalent capacitance of the comparator 630 and the driver 640 of FIG. 8. The dummy unit 700 may electrically connect the second capacitor 720 with the set voltage generation unit 500 when the reset signal RST is enabled (that is, the set signal SET is disabled), and may increase the capacitance anticipated by the set voltage generation unit 500.

Figure 10:
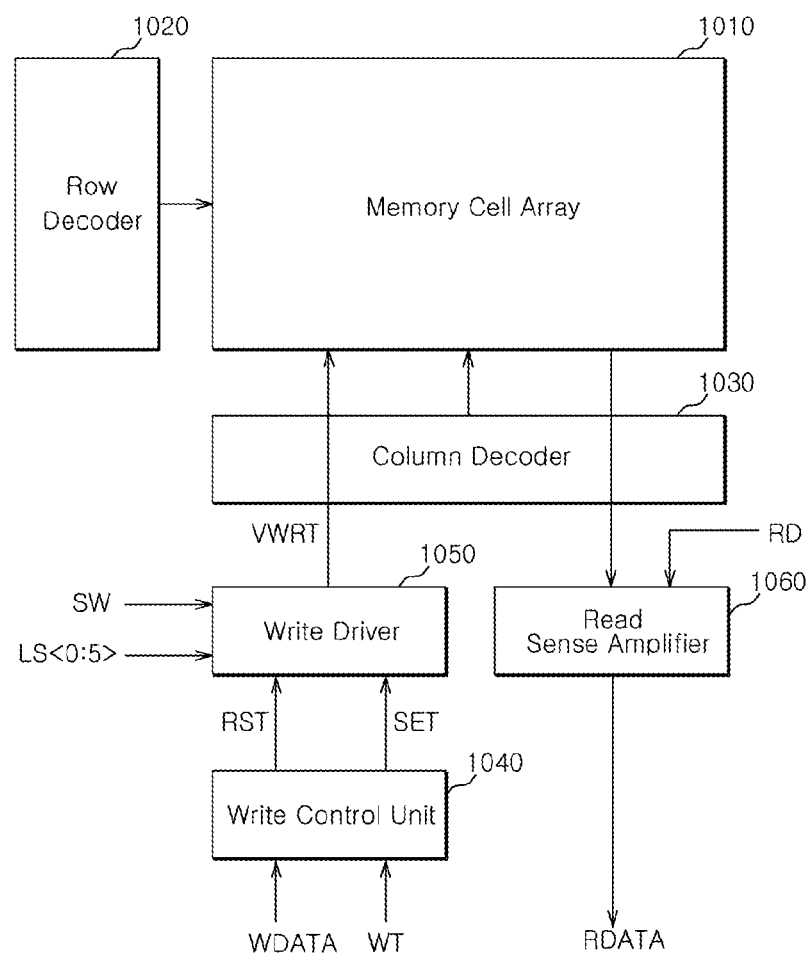
FIG. 10 is a diagram showing the configuration of a semiconductor memory apparatus in accordance with an embodiment of the present invention.

FIG. 10 is a diagram showing the configuration of a semiconductor memory apparatus 3 in accordance with an embodiment of the present invention. In FIG. 10, the semiconductor memory apparatus 3 may include a memory cell array 1010, a row decoder 1020, a column decoder 1030, a write control unit 1040, and a write driver 1050. The memory cell array 1010 may include a plurality of memory cells which are electrically coupled with word lines and bit lines. The row decoder 1020 may be configured to select a word line to which a memory cell accessed in response to a row address signal is coupled. The column decoder 1030 selects a bit line to which the memory cell is coupled, in response to a column address signal.

The write control unit 1040 may generate the write control signals including the reset signal RST and the set signal SET, in response to write data WDATA and a write signal WT. The write data WDATA is inputted from a processor or a controller to write data in the memory cell. The write signal WT is an internal signal which is generated based on a command inputted from the processor or the controller.

The write driver 1050 may be configured to provide the write voltage VWRT generated based on one of the reset voltage and the set voltage, in response to the control signal SW, the level setting signals LS<0:5> and the write control signals RST and SET, to the selected memory cell. The write driver 1050 provides the write voltage VWRT to the memory cell such that desired data can be written in the memory cell.

In FIG. 10, the semiconductor memory apparatus 3 further may include a read sense amplifier 1060. The read sense amplifier 1060 may read the data stored in the memory cell, in response to a read signal RD, and may output read data RDATA. The read data RDATA may be outputted to the processor or the controller.

While various embodiments have been described above, it will be understood to those skilled in the art that the embodiments described are by way of example only. Accordingly, the voltage generation circuit, and the write driver and the semiconductor memory apparatus including the same described herein should not be limited based on the described embodiments. Rather, the voltage generation circuit, and the write driver and the semiconductor memory apparatus including the same described herein should only be limited in light of the claims that follow when taken in conjunction with the above description and accompanying drawings.

What is claimed is:

1. A voltage generation circuit comprising:
   a charge unit configured for raising a level of a ramp voltage to a predetermined level in response to a control signal; and
   a discharge unit configured for lowering the level of the ramp voltage in response to the control signal,
   wherein the discharge unit uses a constant current source to lower the level of the ramp voltage,
   wherein the charge unit includes a voltage applying section coupled to a first switching section and the first switching section coupled to a first capacitor and the discharge unit, wherein the constant current source of the discharge unit is configured to discharge the first capacitor in response to the control signal, received by both the first switching section and the discharge unit, thereby continuously and linearly lowering the level of the ramp voltage, and wherein the charge unit is configured for receiving level setting signals to raise the level of the ramp voltage to the predetermined level.

2. A voltage generation circuit according to claim 1, further comprising an output unit configured to compare levels of the ramp voltage and output voltage and generate the output voltage.

3. A voltage generation circuit comprising:
a charge unit configured to raise a level of a ramp voltage to a predetermined level in response to a control signal and level setting signals;
a discharge unit configured to constantly lower the level of the ramp voltage raised to the predetermined level in response to the control signal; and
an output unit configured to compare levels of the ramp voltage and an output voltage and generate the output voltage,
wherein the charge unit comprises a voltage applying section configured to provide a voltage of the predetermined level in response to the level setting signals.

4. The voltage generation circuit according to claim 3, wherein the charge unit further comprises:
a first switching section configured to transfer the voltage of the predetermined level in response to the control signal; and
a capacitor configured to receive the voltage of the predetermined level transferred from the first switching section.

5. The voltage generation circuit according to claim 4, wherein the discharge unit comprises:
a second switching section configured to be coupled with the capacitor in response to the control signal; and
a current source configured to electrically connect the capacitor with a ground voltage when the second switching section is turned on.

6. The voltage generation circuit according to claim 3, wherein the output unit comprises:
a comparator configured to compare the ramp voltage and the output voltage and generate a comparison signal; and
a driver configured to receive the comparison signal and generate the output voltage.

7. A write driver comprising:
a reset voltage generation unit configured to generate a reset voltage;
a set voltage generation unit configured to generate a set voltage which is raised to a predetermined level and is lowered with a constant slope based on a control signal and level setting signals;
a write voltage output unit configured to generate a write voltage based on one of the reset voltage and the set voltage in response to write control signals; and
a dummy unit configured to increase capacitance of a node from which the set voltage is generated, in response to the write control signals,
wherein the set voltage generation unit comprises a charge unit configured to raise a level of the set voltage to the predetermined level in response to the control signal and the level setting signals.

8. The write driver according to claim 7, wherein the set voltage generation unit further comprises a discharge unit configured to lower the level of the set voltage with the constant slope in response to the control signal.

9. The write driver according to claim 8, wherein the charge unit comprises:
a voltage applying section configured to provide a voltage of the predetermined level in response to the level setting signals;
a first switching section configured to transfer the voltage of the predetermined level in response to the control signal; and
a first capacitor configured to receive the voltage of the predetermined level transferred from the first switching section.

10. The write driver according to claim 9, wherein the discharge unit comprises:
a second switching section configured to be coupled with the first capacitor in response to the control signal; and
a current source configured to electrically connect the first capacitor with a ground voltage when the second switching section is turned on.

11. The write driver according to claim 7, wherein the write voltage output unit comprises:
a voltage selecting section configured to output one of the reset voltage and the set voltage in response to the write control signals;
a comparator configured to compare an output of the voltage selecting section and the write voltage and generate a comparison signal; and
a driver configured to receive the comparison signal and generate the write voltage.

12. The write driver according to claim 7, wherein the dummy unit increases the capacitance of the node from which the set voltage is generated, when the write voltage is generated based on the reset voltage.

13. The write driver according to claim 7, wherein the dummy unit comprises:
a second capacitor; and
a third switching section configured to electrically connect the node from which the set voltage is generated, with the second capacitor in response to the write control signals.

14. A semiconductor memory apparatus comprising:
a write control unit configured to generate a control signal, level setting signals and write control signals in response to write data and a write signal;
a reset voltage generation unit configured to generate a reset voltage;
a set voltage generation unit configured to generate a set voltage which is raised to a predetermined level and is lowered with a constant slope based on the control signal and the level setting signals;
a write voltage output unit configured to generate a write voltage based on one of the reset voltage and the set voltage in response to the write control signals;
a dummy unit configured to increase capacitance of a node from which the set voltage is generated, in response to the write control signals; and
a memory cell configured to store the write data according to the write voltage,
wherein the set voltage generation unit comprises a charge unit configured to raise a level of the set voltage to the predetermined level in response to the control signal and the level setting signals.

15. The semiconductor memory apparatus according to claim 14, wherein the set voltage generation unit further comprises a discharge unit configured to lower the level of the set voltage with the constant slope in response to the control signal.

16. The semiconductor memory apparatus according to claim 15, wherein the charge unit comprises:

a voltage applying section configured to provide a voltage of the predetermined level in response to the level setting signals;

a first switching section configured to transfer the voltage of the predetermined level in response to the control signal; and a first capacitor configured to receive the voltage of the predetermined level transferred from the first switching section.

17. The semiconductor memory apparatus according to claim 16, wherein the discharge unit comprises:

a second switching section configured to be coupled with the first capacitor in response to the control signal; and a current source configured to electrically connect the first capacitor with a ground voltage when the second switching section is turned on.

18. The semiconductor memory apparatus according to claim 14, wherein the write voltage output unit comprises:

a voltage selecting section configured to output one of the reset voltage and the set voltage in response to the write control signals;

a comparator configured to compare an output of the voltage selecting section and the write voltage and generate a comparison signal; and a driver configured to receive the comparison signal and generate the write voltage.

19. The semiconductor memory apparatus according to claim 14, wherein the dummy unit increases the capacitance of the node from which the set voltage is generated, when the write voltage is generated based on the reset voltage.

20. The semiconductor memory apparatus according to claim 14, wherein the dummy unit comprises:

a second capacitor; and a third switching section configured to electrically connect the node from which the set voltage is generated, with the second capacitor in response to the write control signals.

* * * * *